United States Patent
Shiga et al.

(10) Patent No.: US 7,138,674 B2
(45) Date of Patent: Nov. 21, 2006

(54) SEMICONDUCTOR MEMORY DEVICE

(75) Inventors: Hidehiro Shiga, Kawasaki (JP);
Shinichiro Shiratake, Yokohama (JP);
Daisaburo Takashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 205 days.

(21) Appl. No.: 10/624,483

(22) Filed: Jul. 23, 2003

(65) Prior Publication Data
US 2005/0243599 A1 Nov. 3, 2005

(30) Foreign Application Priority Data
May 16, 2003 (JP) .............................. 2003-139271

(51) Int. Cl.
*H01L 31/62* (2006.01)
(52) U.S. Cl. ................ 257/295; 257/296; 257/E27.104
(58) Field of Classification Search .................. 257/295
See application file for complete search history.

(56) References Cited

U.S. PATENT DOCUMENTS

| | | | |
|---|---|---|---|
| 5,430,671 A | 7/1995 | Hirano et al. | |
| 5,617,349 A | 4/1997 | Koike | |
| 5,903,492 A | 5/1999 | Takashima | |
| 2002/0027798 A1* | 3/2002 | Takashima | 365/145 |
| 2002/0123203 A1* | 9/2002 | Dehm et al. | 438/387 |

FOREIGN PATENT DOCUMENTS

| | | |
|---|---|---|
| JP | 7-335738 | 12/1995 |
| JP | 8-36888 | 2/1998 |
| JP | 10-255483 | 9/1998 |
| JP | 2000-156472 | 6/2000 |
| JP | 2002-197856 | 7/2002 |
| KR | 1998-069790 | 10/1998 |

* cited by examiner

*Primary Examiner*—Tu-Tu Ho
(74) *Attorney, Agent, or Firm*—Oblon, Spivak, McClelland, Maier & Neustadt, P.C.

(57) ABSTRACT

A semiconductor memory device includes a cell block composed of several series-connected units having a ferroelectric capacitor and a cell transistor parallel-connected to the ferroelectric capacitor and a select transistor connected to an end of the cell block. Mutually separated first impurity diffusion layers are formed on the surface of the semiconductor substrate along a first direction, and have a first area. A second impurity diffusion layer is formed on the surface of the semiconductor substrate separated from the end first impurity diffusion layer, and has a second area. A first gate electrode is provided on the semiconductor substrate between the first impurity diffusion layers along a second direction. A second gate electrode is provided on the semiconductor substrate between the end first impurity diffusion layer and the second impurity diffusion layer along a second direction. A contact electrically connects a bit line and the second impurity diffusion layer.

10 Claims, 5 Drawing Sheets

SEMICONDUCTOR MEMORY DEVICE

CROSS-REFERENCE TO RELATED APPLICATIONS

This application is based upon and claims the benefit of priority from the prior Japanese Patent Application No. 2003-139271, filed May 16, 2003, the entire contents of which are incorporated herein by reference.

BACKGROUND OF THE INVENTION

1. Field of the Invention

The present invention relates to a semiconductor memory device. In particular, the present invention relates to a semiconductor memory device using a memory cell formed of a ferroelectric material.

2. Description of the Related Art

FIG. 8 and FIG. 9 individually show a circuit diagram and cross-sectional view of a semiconductor memory device using a memory cell formed of a ferroelectric material. As shown is FIG. 8 and FIG. 9, a unit cell U is formed in a manner that source and drain terminals of a cell transistor T are connected to both terminals of a ferroelectric capacitor C. Several unit cells U are connected in series. A cell block CB is composed of several unit cells. The cell block CB is connected to a bit line BL via a select transistor ST. A ferroelectric memory having the foregoing structure is called a TC parallel unit series connection type ferroelectric memory. In the cell block CB, interconnection connected to a termination unit cell U opposite to the select transistor ST is called a plate line PL.

FIG. 10 is a graph showing the relationship between data read voltage and bit line capacitance in ferroelectric memory. As seen from FIG. 10, the bit line capacitance is optimized, and thereby the maximum read voltage is obtained. However, actually manufactured ferroelectric memories have bit line capacitance larger than the optimal value. For this reason, the read voltage is larger than the maximum value. As a result, there is a high possibility that read data is affected by noise.

BRIEF SUMMARY OF THE INVENTION

According to a first aspect of the present invention, there is provided a semiconductor memory device, which includes: a cell block composed of several series-connected units having a ferroelectric capacitor and a cell transistor parallel-connected to the ferroelectric capacitor; and a select transistor connected to an end of the cell block, the semiconductor memory device comprising: a semiconductor substrate; a plurality of first impurity diffusion layers formed on the surface of the semiconductor substrate in a state of being mutually separated along a first direction, having a first area, and constituting a source/drain diffusion layer of the cell transistor; a second impurity diffusion layer formed on the surface of the semiconductor substrate in a state of being separated from the first impurity diffusion layer of an end of the first impurity diffusion layers, having a second area, and constituting a source/drain diffusion layer of the cell transistor; a plurality of first gate electrodes provided on the semiconductor substrate with a gate insulating film interposed therebetween between the first impurity diffusion layers along a second direction, and constituting a gate of the cell transistor; a second gate electrode provided on the semiconductor substrate with a gate insulating film interposed therebetween between the first impurity diffusion layer of the end and the second impurity diffusion layer along a second direction, and constituting a gate of the select transistor; and a contact electrically connecting a bit line and the second impurity diffusion layer.

DETAILED DESCRIPTION OF THE INVENTION

Figure 8:
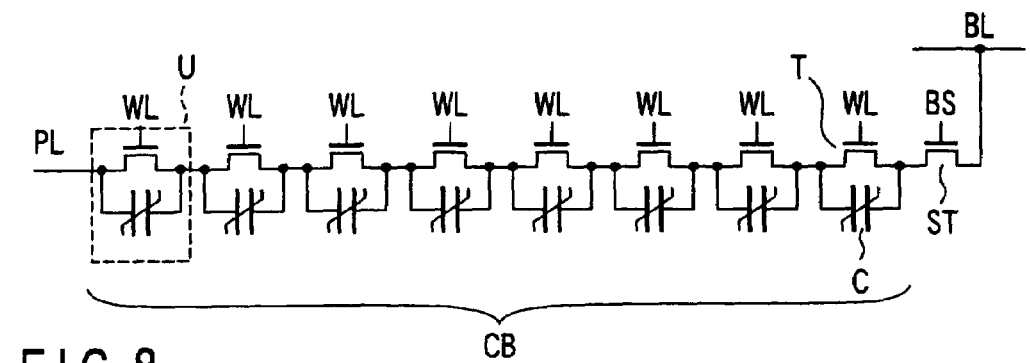
FIG. 8 is a circuit diagram of a conventional semiconductor memory device.
Figure 9:
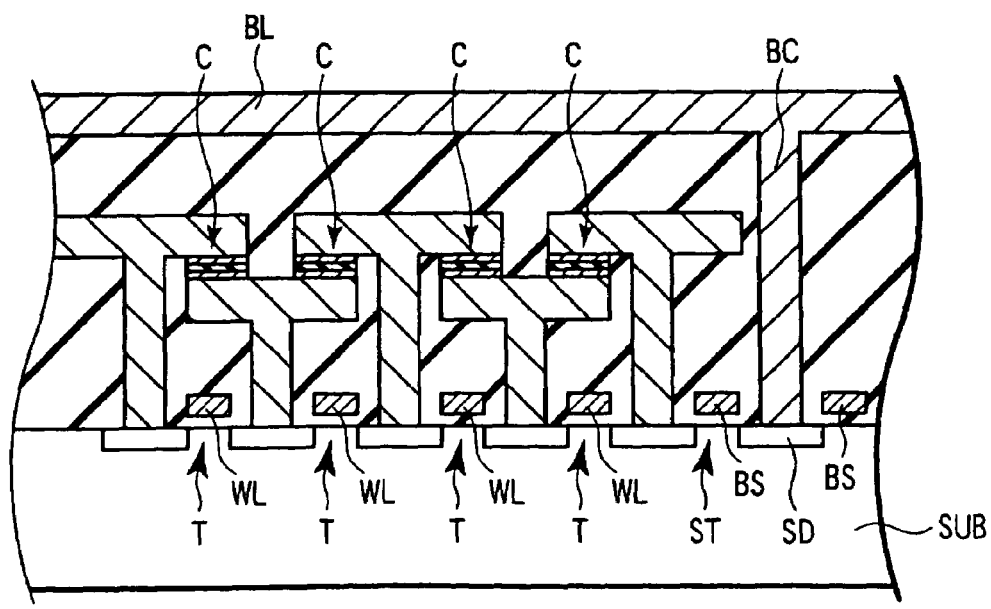
FIG. 9 is a view showing the sectional structure of the conventional semiconductor memory device.

The inventors have studied the method of reducing bit line capacitance in the ferroelectric memory described in FIG. 8 and FIG. 9 in the development process of the present invention. As a result, the inventors have obtained knowledge described below.

Parasitic capacitance of a select transistor ST is given as one of the causes of increasing the bit line capacitance. Several cell blocks CB shown in FIG. 8 are connected to the bit line BL; therefore, there exist several select transistors ST connected to the bit line BL. Consequently, the parasitic capacitance of each select transistor ST is reduced, and thereby, it is possible to greatly reduce the parasitic capacitance of the bit line BL.

The following capacitances exist as the parasitic capacitance of the select transistor ST. One is junction capacitance between a source/drain diffusion layer SD and a substrate sub in FIG. 9. Another is capacitance formed in a gate oxide film between the source/drain diffusion layer SD and a gate electrode BS. The area of the source/drain diffusion layer SD is made small, and thereby, the capacitances described above can be reduced.

Figure 11:
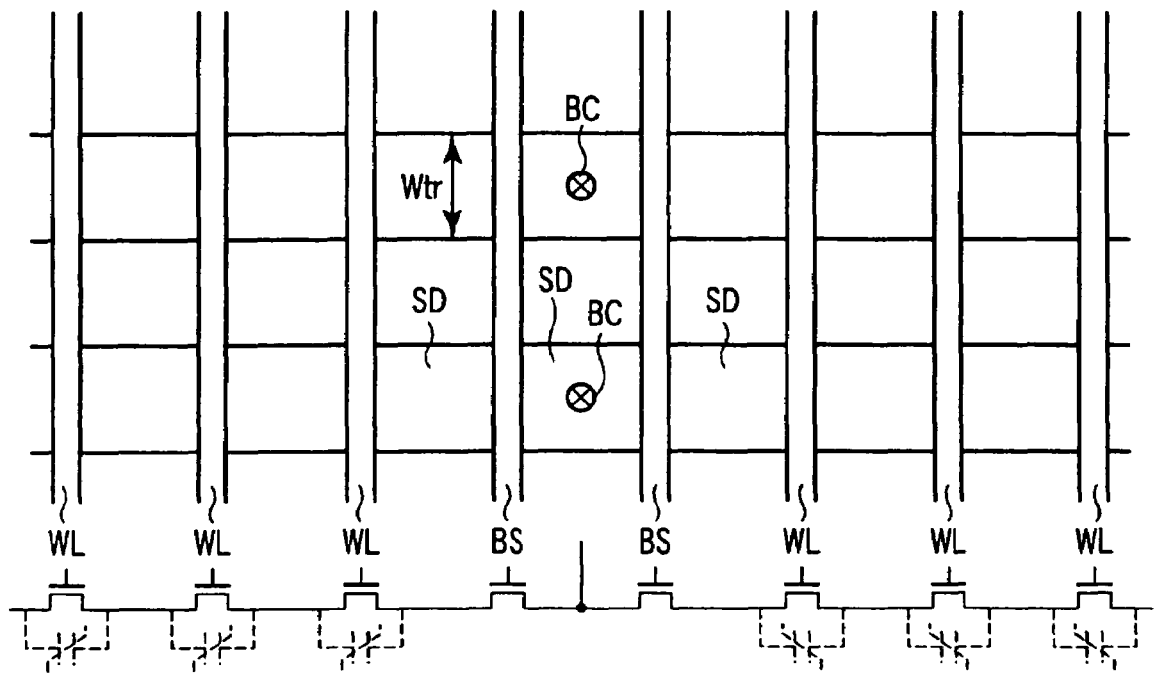
FIG. 11 is a view showing the face structure of the conventional semiconductor memory device.

FIG. 11 shows part of the surface structure of the ferroelectric memory shown in FIG. 8 and FIG. 9. The width Wtr of the source/drain diffusion layer SD is made small, and thereby, the area of the source/drain diffusion layer SD of the select transistor ST can be made small. However, according to the method described above, the width of the source/drain diffusion layer SD of a cell transistor T is also reduced. As a result, the resistance value of each cell transistor T increases; for this reason, the resistance value between the plate line PL and the bit line BL greatly increases. The increase of the resistance value is a factor of remarkably reducing data read/write speed.

Embodiments of the present invention made based on the foregoing knowledge will be described below with reference to the accompanying drawings. In the following description, the same reference numerals are used to designate components having the identical function and configuration. Overlapping explanation will be made if necessary.

(First Embodiment)

Figure 1:
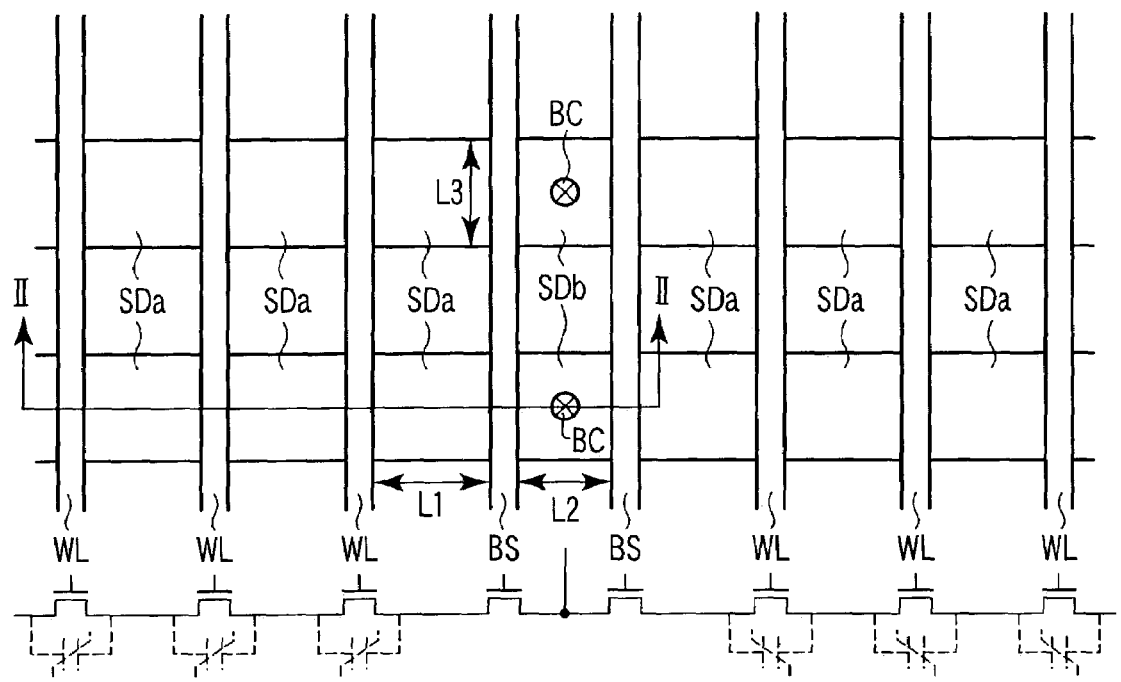
FIG. 1 is a view schematically showing the surface structure of a semiconductor memory device according to a first embodiment of the present invention.
Figure 2:
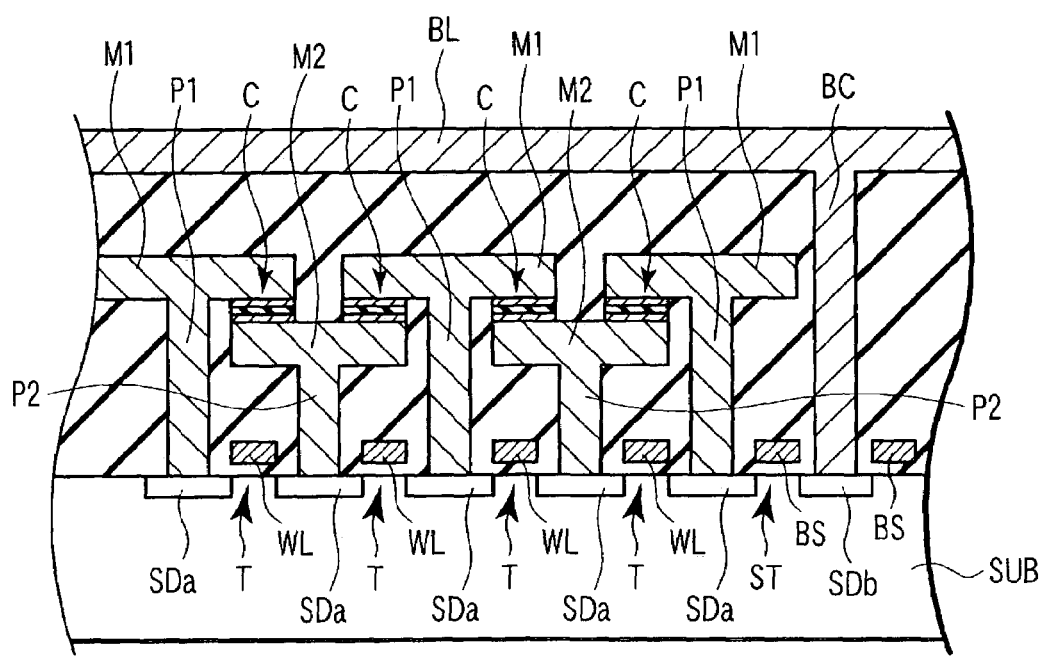
FIG. 2 is a view schematically showing the sectional structure taken along a line II—II of FIG. 1.

FIG. 1 is a view schematically showing the surface structure of a semiconductor memory device according to a first embodiment of the present invention. FIG. 2 is a view schematically showing the sectional structure taken along a line II—II of FIG. 1. In FIG. 1, some components are omitted for simplification of drawing.

As shown in FIG. 1 and FIG. 2, the surface of the semiconductor substrate sub is formed with several source/drain diffusion layers SDa (first impurity diffusion layer). The source/drain diffusion layers SDa are separated from each other, and formed along a first direction (horizontal direction in FIG. 1). The source/drain diffusion layers SDa has a first length L1 in the first direction, and also, has a third length L3 in a gate electrode extending direction (second direction) described later. The source/drain diffusion layers SDa has a first area.

The surface of the semiconductor substrate sub is formed with a source/drain diffusion layer SDb (second impurity diffusion layer). The source/drain diffusion layer SDb is formed at the position separating from adjacent source/drain diffusion layers SDa, and its one end faces the source/drain diffusion layers SDa. The source/drain diffusion layer SDb has a second length L2 shorter than the first length L1 in the first direction, and also, has the same third length L3 as the source/drain diffusion layer SDa in the second direction. The source/drain diffusion layers SDb has a second area.

The other end of the source/drain diffusion layer SDb is formed with several source/drain diffusion layers SDa, which are separated from each other along the first direction. The structure comprising several source/drain diffusion layers SDa and SDb successively formed along the first direction is formed plurally in a state of being mutually separated in the second direction.

A gate electrode WL (first gate electrode) is provided on the semiconductor substrate sub between the source/drain diffusion layers SDa with a gate insulating film interposed therebetween (not shown). The gate electrode WL extends in the second direction. The gate electrode WL and source/drain diffusion layers SDa positioned on both sides of the gate electrode WL constitute a cell transistor T.

One source/drain diffusion layer SDa of each cell transistor T is connected to an interconnection layer M1 via a contact P1. The interconnection layer M1 is connected with a ferroelectric capacitor C. The ferroelectric capacitor C is composed of top (first) and bottom (second) electrodes, and a ferroelectric film held between both electrodes. The top electrode is connected with the interconnection layer M1. The bottom electrode is connected with an interconnection layer M2. The interconnection layer M2 is connected with the other source/drain diffusion layer SDa of the cell transistor T via a contact P2. The cell transistor T and the ferroelectric capacitor C are connected in parallel, and thereby, a unit cell U is formed. As seen from FIG. 8, several unit cells U are connected in series, and thereby, the cell block CB is formed.

A gate electrode BS (second gate electrode) is provided on the semiconductor substrate between source/drain diffusion layers SDa and SDb via a gate insulator (not shown). The gate electrode BS extends in the second direction. The gate electrode BS and source/drain diffusion layers SDa and SDb positioned on both sides of the gate electrode BS constitute a select transistor ST.

The source/drain diffusion layer SDb is connected with the bit line BL via a bit line contact BC. The bit line BL extends in the first direction above the unit cell U.

Figure 10:
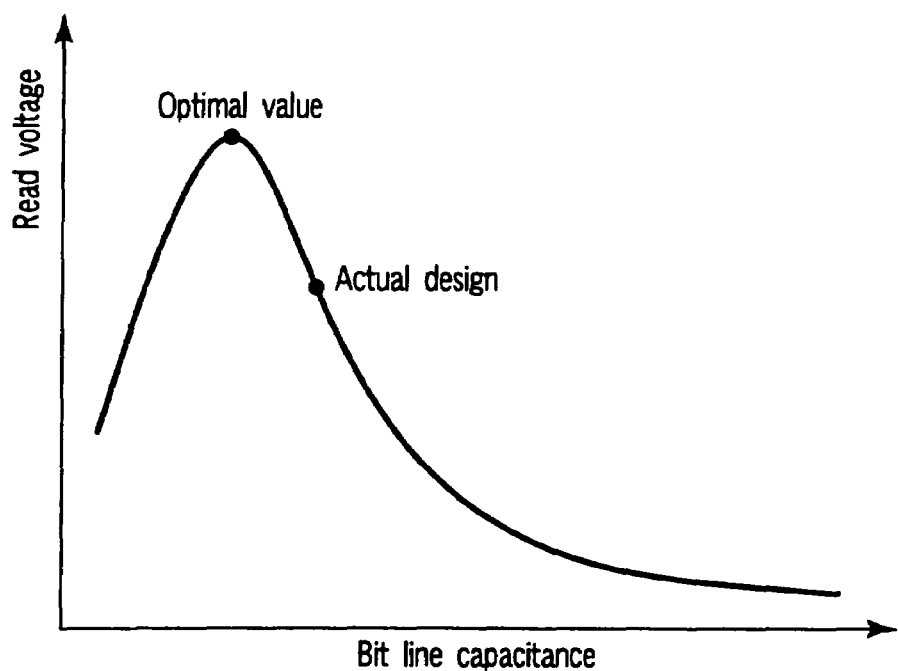
FIG. 10 a graph showing the relationship between data read voltage and bit line capacitance in a ferroelectric memory.

The semiconductor memory device according to the first embodiment of the present invention has the following features. The source/drain diffusion layer SDb constituting the select transistor ST and connected to the bit line contact BC has the area smaller than the source/drain diffusion layers SDa constituting the cell transistor T. Thus, the area of the boundary between the source/drain diffusion layers SDb and the semiconductor substrate sub decreases, so that the parasitic capacitance at the boundary can be reduced. Therefore, the capacitance of the bit line BL connected to the select transistor ST decreases. As a result, the read voltage approaches the optimal value shown in FIG. 10, and the influence by data read error and noise is reduced.

The semiconductor memory device according to the first embodiment also has the following features. The area of the source/drain diffusion layer SDb constituting the select transistor ST is reduced without decreasing the area of the source/drain diffusion layers SDa constituting the cell transistor T. Thus, it is possible to reduce the capacitance of the bit line BL without increasing the resistance value of the cell transistor T. In other words, it is possible to increase the read voltage without reducing data read/write speed.

The area of the source/drain diffusion layer SDb decreases, and thereby, the resistance value of the select transistor ST also increases slightly. However, the resistance value from the interconnection (plate line PL) at the end opposite to the select transistor ST to the bit line BL is substantially determined by the resistance value of the cell transistor T. That is, even if the resistance value of the select transistor ST slightly increases, there is almost no influence on the resistance value from the plate line PL to the bit line BL.

(Second Embodiment)

According to the second embodiment, the source/drain diffusion layer SDb has a short length in the second direction, and thereby, the area of the source/drain diffusion layer SDb can be decreased.

Figure 3:
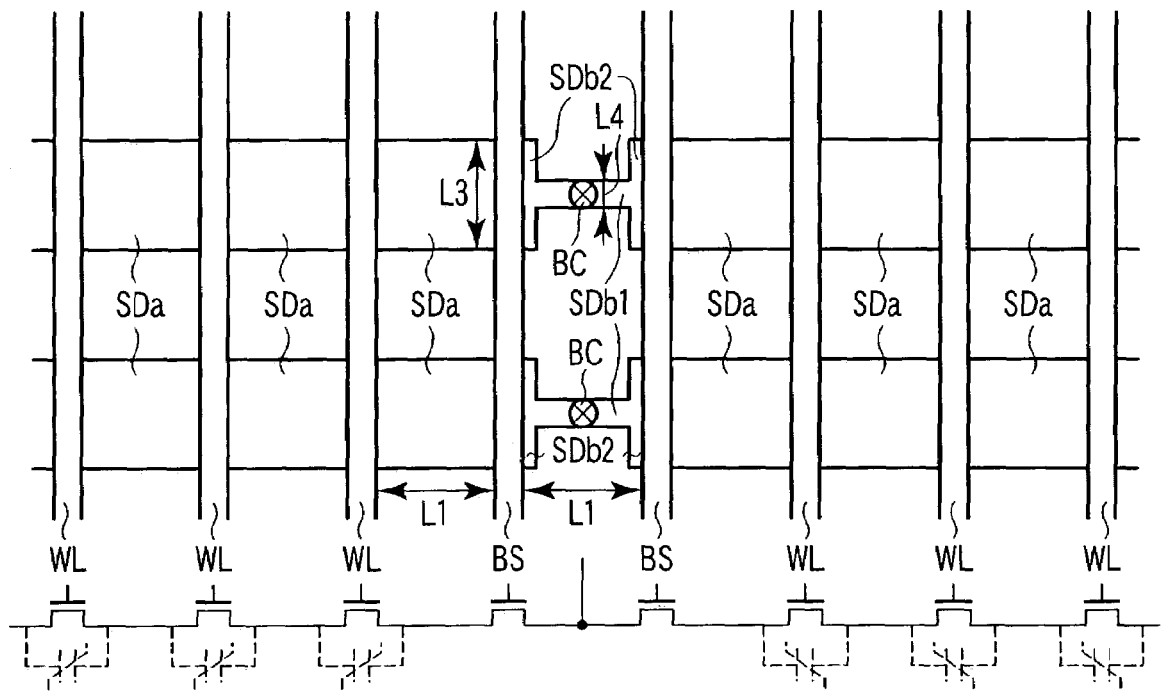
FIG. 3 is a view schematically showing the face structure of a semiconductor memory device according to a second embodiment of the present invention.

FIG. 3 is a view schematically showing the surface structure of a semiconductor memory device according to a second embodiment of the present invention. In FIG. 3, source/drain diffusion layers SDa, SDb, gate electrodes WL, BS, bit line contact BC and bit line BL are only shown, like FIG. 1. In the sectional structure, the source/drain diffusion layer SDb of FIG. 2 has the structure having the same width as the source/drain diffusion layers SDa. In other words, the source/drain diffusion layer SDb of FIG. 2 has the same structure as FIG. 9.

As seen from FIG. 3, the source/drain diffusion layer SDb has a first part SDb1 (first region) and a second part SDb2 (second region). The first part SDb1 is connected to the bit line contact BC, and the second part SDb2 extends in the second direction near the gate electrode BS. The first part SDb1 has a fourth length L4 shorter than the third length L3 in the second direction. The second part SDb2 has a third length L3 in the second direction.

The shorter the fourth length L4, the smaller the area of the source/drain diffusion layer SDb. If the length L4 is too short, however, a contact hole for the bit line contact BC may not be located above the first part SDb1 because of misalignment of mask. On the other hand, the bit line contact BC need not be located, in its entirety, on the first part SDb1. Thus it is important that the fourth length L4 is as short as possible so long as the bit line contact BS and the first part SDb1 are electrically connected as is desired.

The larger the ratio of the first part SDb1 occupying the source/drain diffusion layer SDb, the smaller the area of the source/drain diffusion layer SDb. As a result, the effect described later is enhanced.

The semiconductor memory device according to the second embodiment of the present invention has the following features. The source/drain diffusion layer SDb has the area smaller than the source/drain diffusion layers SDa, like the first embodiment. Thus, the same effect as the first embodiment is obtained.

In addition, even if the resistance value of the select transistor ST increases, there is almost no influence on the resistance value from the plate line PL to the bit line BL, like the first embodiment.

As described in the first embodiment, the length of the source/drain diffusion layer SDb in the first direction may be set as the second length L2. As a result, the area of source/drain diffusion layer SDb is further reduced, so that the foregoing effect can be enhanced.

(Third Embodiment)

According to the third embodiment, the area of source/drain diffusion layers SDa and SDb facing the gate electrode BS is smaller than that of the cell transistor T.

Figure 4:
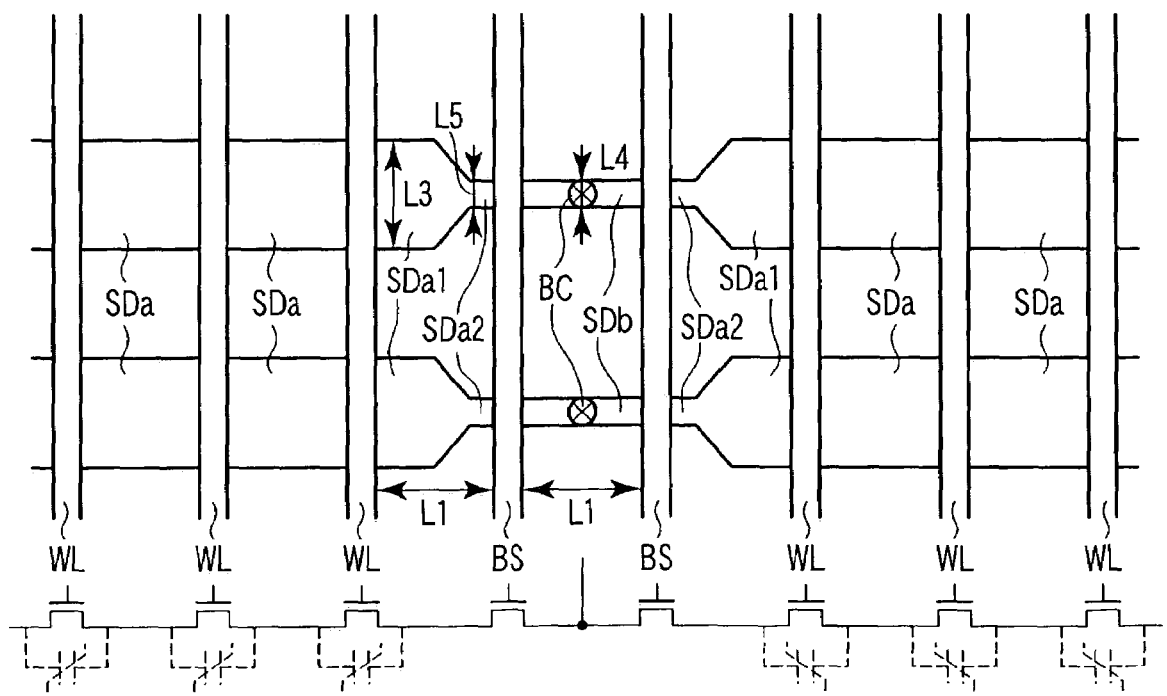
FIG. 4 is a view schematically showing the face structure of a semiconductor memory device according to a third embodiment of the present invention.

FIG. 4 is a view schematically showing the surface structure of a semiconductor memory device according to a third embodiment of the present invention. In FIG. 4, source/drain diffusion layers SDa, SDb, gate electrodes WL, BS, bit line contact BC and bit line BL are only shown, like FIG. 1. The sectional structure is the same as FIG. 9.

As illustrated in FIG. 4, the source/drain diffusion layer SDb has a fourth length L4 in the second direction. Both ends of the source/drain diffusion layer SDb reach the gate electrode BS.

The source/drain diffusion layers SDa (source/drain diffusion layer used common in select transistor ST and cell transistor T) of the end cell transistor T has first and second parts SDb1 and SDa2. The first part SDb1 is situated on the gate electrode WL side. The second part SDa2 (third region) is situated on the gate electrode BS side, and reaches the gate electrode BS.

The first part SDb1 has the same third length L3 as the source/drain diffusion layer SDa of other cell transistors in the second direction. The second part SDa2 has a fifth length L5 shorter than the third length L3 in the second direction. The fifth length L5 may be set to the same fourth length L4 as the source/drain diffusion layer SDb of the select transistor ST.

The semiconductor memory device according to the third embodiment of the present invention has the following features. The source/drain diffusion layer SDb has the area smaller than the source/drain diffusion layer SDa, like the first embodiment. Thus, the same effect as the first embodiment is obtained.

In addition, the semiconductor memory device according to the third embodiment has the following features. The source/drain diffusion layer SDb has the fourth length L4 in the second direction, and the second part SDa2 of the source/drain diffusion layer SDa has the fifth length L5 in the second direction. The fourth and fifth lengths L4 and L5 are shorter than the third length L3 of the cell transistor T. In other words, the source/drain diffusion layer (source/drain diffusion layer SDb) of the select transistor ST has the area facing the gate electrode BS, which is smaller than the cell transistor T. Therefore, in the select transistor ST, it is possible to reduce the parasitic capacitance between the source/drain diffusion layer SDb and the gate electrode BS. As a result, the capacitance of the bit line BL can be reduced.

Even if the resistance value of the select transistor ST increases, there is almost no influence on the resistance value from the plate line PL to the bit line BL, like the first embodiment.

As described in the first embodiment, the length of the source/drain diffusion layer SDb in the first direction may be set as the second length L2. As a result, the area of source/drain diffusion layer SDb is further reduced, so that the effect described in the first embodiment can be enhanced.

(Fourth Embodiment)

According to the fourth embodiment, the semiconductor memory device has an impurity region formed in a channel region of the select transistor ST, in addition to the structure described in the third embodiment.

Figure 5:
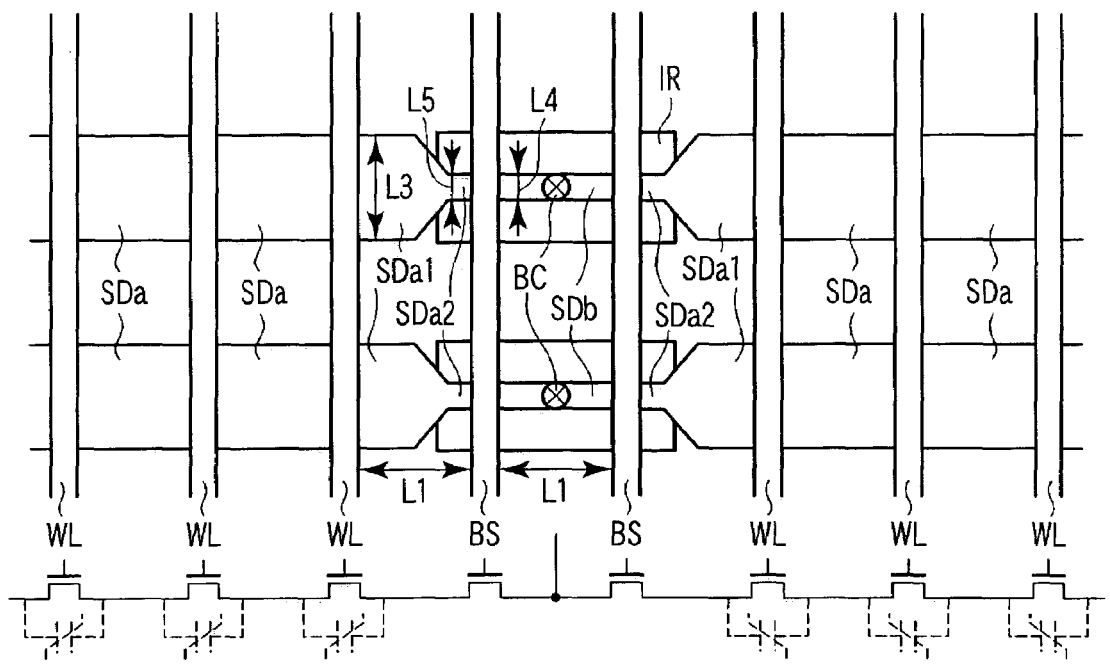
FIG. 5 is a view schematically showing the face structure of a semiconductor memory device according to a fourth embodiment of the present invention.

FIG. 5 is a view schematically showing the surface structure of a semiconductor memory device according to a fourth embodiment of the present invention. In FIG. 5, source/drain diffusion layers SDa, SDb, gate electrodes WL, BS, bit line contact BC and bit line BL are only shown, like FIG. 1. The sectional structure is the same as FIG. 9.

As shown in FIG. 5, an impurity region IR is formed on the surface of the semiconductor substrate sub near the second part SDa2 of the source/drain diffusion layer SDa and the source/drain diffusion layer SDb. The impurity region IR may be at least formed in the channel region of the select transistor ST. In other words, the impurity region IR is formed on the surface of the semiconductor substrate sub between the second part SDa2 of the source/drain diffusion layers SDa and the source/drain diffusion layers SDb. The impurity region IR is formed by implanting ion to the surface of the semiconductor substrate sub before the formation of the gate electrodes WL and BS. Arsenic, phosphorus and antimony having a function of reducing the threshold voltage of the select transistor are used as ion implanted to the impurity region IR. Reducing the threshold voltage of the select transistor means to increase the current flowing through the select transistor ST when the same voltage as the conventional case is applied.

In the semiconductor memory device according to the fourth embodiment of the present invention, the same effect as the third embodiment is obtained. In addition, in the semiconductor memory device of the fourth embodiment, the impurity region IR is formed on the surface of the semiconductor substrate sub between the second part SDa2 of the source/drain diffusion layer SDa and the source/drain diffusion layer SDb. As a result, the threshold voltage of the select transistor ST steps down. The threshold voltage steps down, and thereby, the current flowing through the select transistor ST increases when the same voltage as the conventional case is applied to the gate electrode BS. The current increase though the select transistor ST can offset the current decrease due to the increase of the resistance value of the select transistor ST. As a result, it is possible to prevent the reduction of data read/write speed.

As described in the first embodiment, the length of the source/drain diffusion layer SDb in the first direction may be set as the second length L2. As a result, the area of source/drain diffusion layer SDb is further reduced, so that the effect described in the first embodiment can be enhanced.

(Fifth Embodiment)

According to the fifth embodiment, a voltage larger than the voltage applied to the gate electrode WL of the cell transistor T is applied to the gate electrode BS of the select transistor ST.

Figure 6:
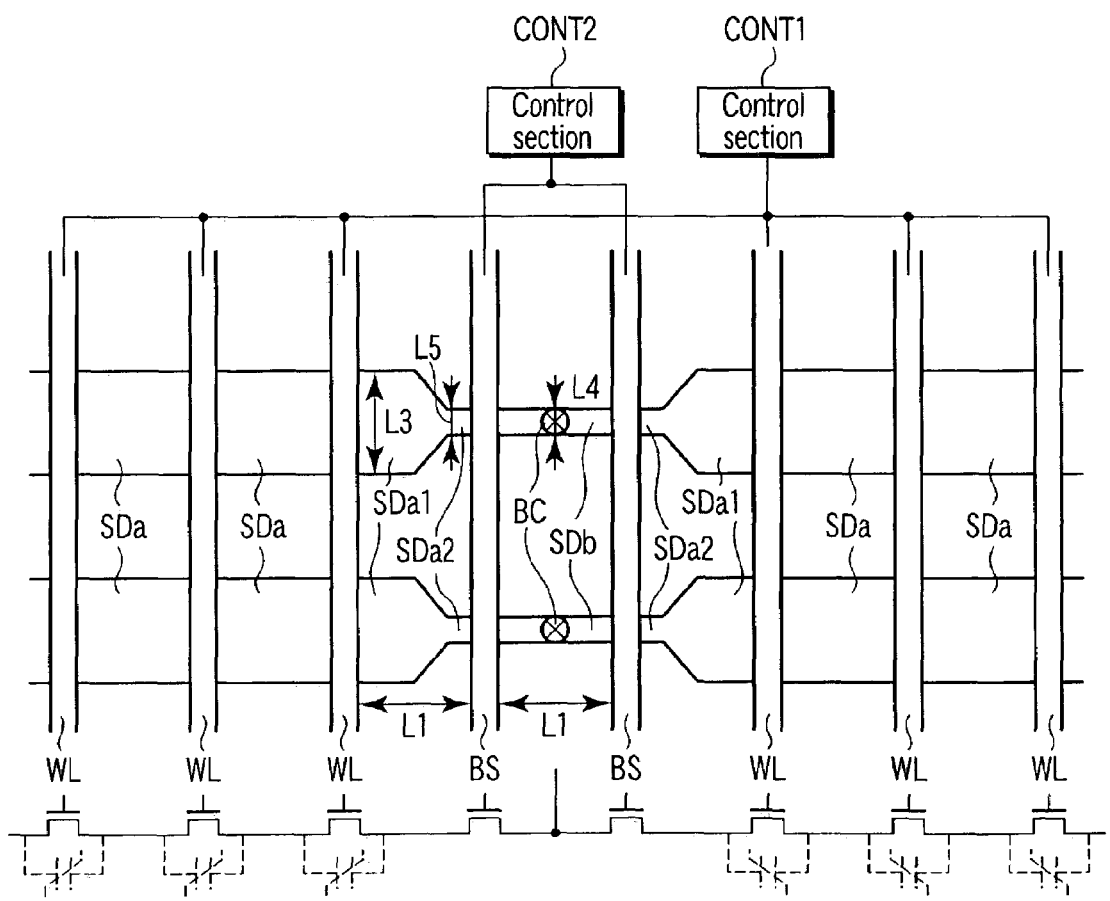
FIG. 6 is a view schematically showing the face structure of a semiconductor memory device according to a fifth embodiment of the present invention.
Figure 7:
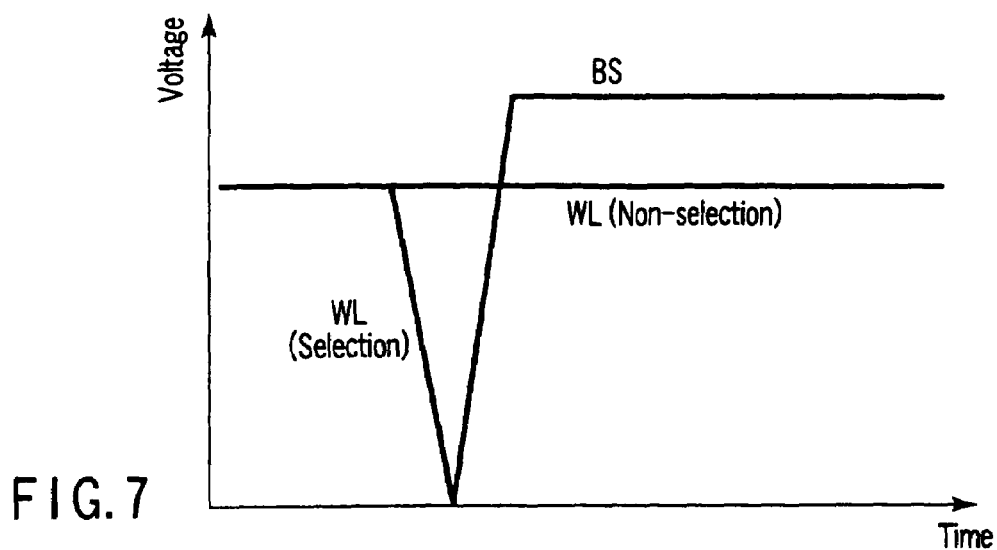
FIG. 7 is a diagram showing voltage applied to a gate electrode.

FIG. 6 is a view schematically showing the structure of a semiconductor memory device according to a fifth embodiment of the present invention. The semiconductor memory device has control sections CONT1 and CONT2, in addition to the structure of the third embodiment (FIG. 4). The control section CONT1 is used for supplying voltage to the gate electrodes WL; on the other hand, the control section CONT2 is used for supplying voltage to the gate electrode BS. Conventionally, the same on-state voltage is applied to the cell transistor T and the select transistor ST. On the contrary, in the fifth embodiment, a voltage larger than the voltage applied to the cell transistor T is applied to the select transistor ST, as seen from FIG. 7.

In the semiconductor memory device according to the fifth embodiment of the present invention, the same effect as the third embodiment is obtained. In addition, in the semiconductor memory device of the fifth embodiment, on-state voltage larger than the cell transistor T is applied to select transistor ST. Thus, larger current flows through the select transistor ST as compared with the case where the same on-state voltage as the cell transistor is applied. The current increase though the select transistor ST can offset the current decrease due to the increase of the resistance value of the select transistor ST. As a result, it is possible to prevent the reduction of data read/write speed.

As described in the first embodiment, the length of the source/drain diffusion layer SDb in the first direction may be set as the second length L2. As a result, the area of source/drain diffusion layer SDb is further reduced, so that the effect described in the first embodiment can be enhanced.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device, which includes: a cell block composed of several series-connected units having a ferroelectric capacitor and a cell transistor parallel-connected to the ferroelectric capacitor; and a select transistor connected to an end of the cell block, the semiconductor memory device comprising:

a semiconductor substrate;

a plurality of first impurity diffusion layers formed on the surface of the semiconductor substrate in a state of being mutually separated along a first direction, having a first area, and constituting a source/drain diffusion layer of the cell transistor;

a second impurity diffusion layer formed on the surface of the semiconductor substrate in a state of being separated from the first impurity diffusion layer of an end of the first impurity diffusion layers, having a second area, constituting a source/drain diffusion layer of the select transistor, and the second area being smaller than the first area;

a plurality of first gate electrodes provided on the semiconductor substrate with a gate insulating film interposed therebetween between the first impurity diffusion layers along a second direction, and constituting a gate of the cell transistor;

a second gate electrode provided on the semiconductor substrate with a gate insulating film interposed therebetween between the first impurity diffusion layer of the end and the second impurity diffusion layer along a second direction, and constituting a gate of the select transistor; and a contact electrically connecting a bit line and the second impurity diffusion layer.

2. The device according to claim 1, further comprising:

a plurality of ferroelectric capacitors having both terminals connected to the first impurity diffusion layers on both sides of the first gate electrode, and having a ferroelectric film, and first and second electrodes sandwiching the ferroelectric film.

3. The device according to claim 1, wherein the first impurity diffusion layers have a first length in the first direction, and the second impurity diffusion layer has a second length shorter than the first length in the first direction.

4. The device according to claim 1, wherein the first impurity diffusion layer have a third length in the second direction, the second impurity diffusion layer has a first region electrically connected to the contact, and the first region has a fourth length shorter than the third length in the second direction.

5. The device according to claim 4, wherein the second impurity diffusion layer has a second region extending along the second direction of the second gate electrode, and the second region has the third length.

6. The device according to claim 4, wherein the first region reaches the second gate electrode.

7. The device according to claim 6, wherein the first impurity diffusion layer of the end has a third region extending along the second direction of the second gate electrode, the third region has a fifth length shorter than the third length.

8. The device according to claim 7, wherein the fifth length is the same as the fourth length.

9. The device according to claim 7, further comprising:

an impurity region formed on the surface of the semiconductor substrate between the first and third regions, and controlling a threshold voltage of the select transistor.

10. The device according to claim 7, further comprising:

a control section applying a first voltage for turning on the cell transistor to the first gate electrode, and applying a second voltage larger than the first voltage for turning on the select transistor to the second gate electrode.

* * * * *